United States Patent
Robinson et al.

(10) Patent No.: US 12,478,790 B2
(45) Date of Patent: Nov. 25, 2025

(54) IMPLANTABLE BIOELECTRONIC DEVICES BASED ON MAGNETOELECTRIC MATERIAL

(71) Applicant: William Marsh Rice University, Houston, TX (US)

(72) Inventors: Jacob T. Robinson, Houston, TX (US); Wonjune Kim, Houston, TX (US); C. Anne Tuppen, Houston, TX (US); Kaiyuan Yang, Houston, TX (US); Yiwei Zou, Houston, TX (US)

(73) Assignee: William Marsh Rice University, Houston, TX (US)

( * ) Notice: Subject to any disclaimer, the term of this patent is extended or adjusted under 35 U.S.C. 154(b) by 0 days.

(21) Appl. No.: 18/819,005

(22) Filed: Aug. 29, 2024

(65) Prior Publication Data
US 2025/0073477 A1 Mar. 6, 2025

Related U.S. Application Data

(60) Provisional application No. 63/579,638, filed on Aug. 30, 2023.

(51) Int. Cl.
*A61N 1/378* (2006.01)
*H10N 30/80* (2023.01)
*H10N 30/853* (2023.01)

(52) U.S. Cl.
CPC .......... *A61N 1/378* (2013.01); *H10N 30/802* (2023.02); *H10N 30/8554* (2023.02)

(58) Field of Classification Search
CPC .. A61N 1/378; H10N 30/8554; H10N 30/802; H10N 35/00; H10N 35/80; H10N 35/101
See application file for complete search history.

(56) References Cited

U.S. PATENT DOCUMENTS

| | | | |
|---|---|---|---|
| 2013/0252030 A1* | 9/2013 | Ryu | H10N 35/00 428/800 |
| 2015/0236242 A1 | 8/2015 | Ryu et al. | |

(Continued)

FOREIGN PATENT DOCUMENTS

| | | | | |
|---|---|---|---|---|
| CN | 110071563 A | * | 7/2019 | |
| CN | 113078255 A | * | 7/2021 | H01L 41/113 |

OTHER PUBLICATIONS

Alrashdan et al., "Wearable wireless power systems for 'ME-BIT' magnetoelectric-powered bio implants," *Journal of Neural Engineering*, 18(4):045011, 2021.

(Continued)

*Primary Examiner* — J. San Martin
(74) *Attorney, Agent, or Firm* — pH IP Law

(57) ABSTRACT

Some disclosed embodiments relate to a system (and/or use of or manufacturing) that includes: a magnetoelectric (ME) component comprising: one or more first layers, wherein each of the one or more first layers comprises a piezoelectric material; one or more second layers, wherein each of the one or more second layers comprises a magnetostrictive material, and wherein a thickness ratio that is defined to be a cumulative thickness of the one or more first layers relative to a cumulative thickness of the one or more second layers is between 0.2 and 0.5. The system may also include an energy harvesting circuit comprising a rectifier circuit, where the energy harvesting circuit is coupled to the ME component.

26 Claims, 10 Drawing Sheets
(9 of 10 Drawing Sheet(s) Filed in Color)

(56) References Cited

U.S. PATENT DOCUMENTS

2015/0287562 A1* 10/2015 Delamare .............. H01H 59/00
                                                          307/125
2019/0089269 A1    3/2019 Delamare et al.
2019/0313908 A1* 10/2019 Melodia ................. G08C 23/02
2022/0168579 A1*  6/2022 Robinson ........... A61N 1/37223

OTHER PUBLICATIONS

Fan et al., "Energy harvesting techniques: energy sources, power management and conversion," *2015 European Conference on Circuit Theory and Design*, pp. 1-4, 2015.

Kawai et al., "MPPT controlled piezoelectric energy harvesting circuit using synchronized switch harvesting on inductor," *41$^{st}$ Annual Conference of the IEEE Industrial Electronics Society*, pp. 1121-1126, 2015.

PCT International Search Report and Written Opinion issued in International Application No. PCT/US2024/044344, mailed Nov. 27, 2024.

* cited by examiner

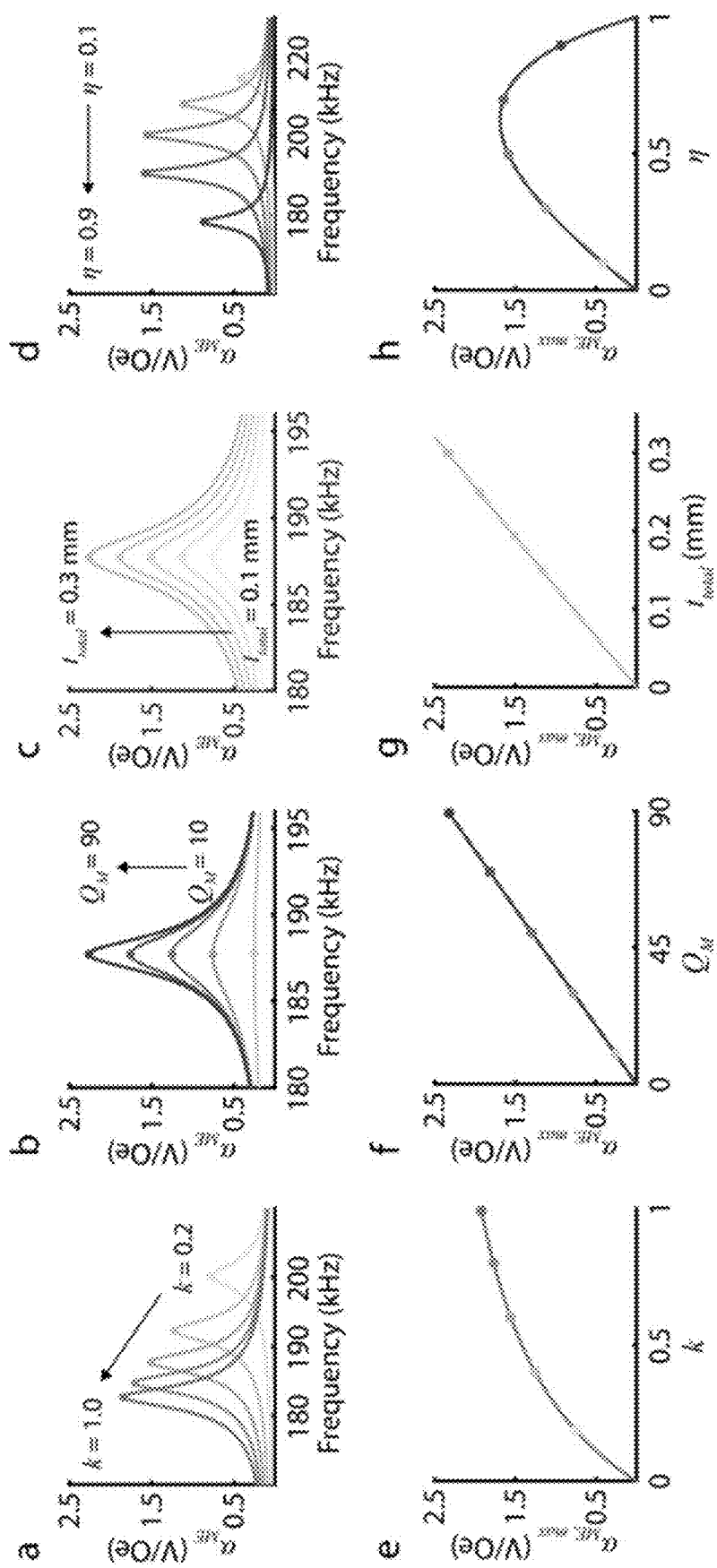
FIGS. 6A-H

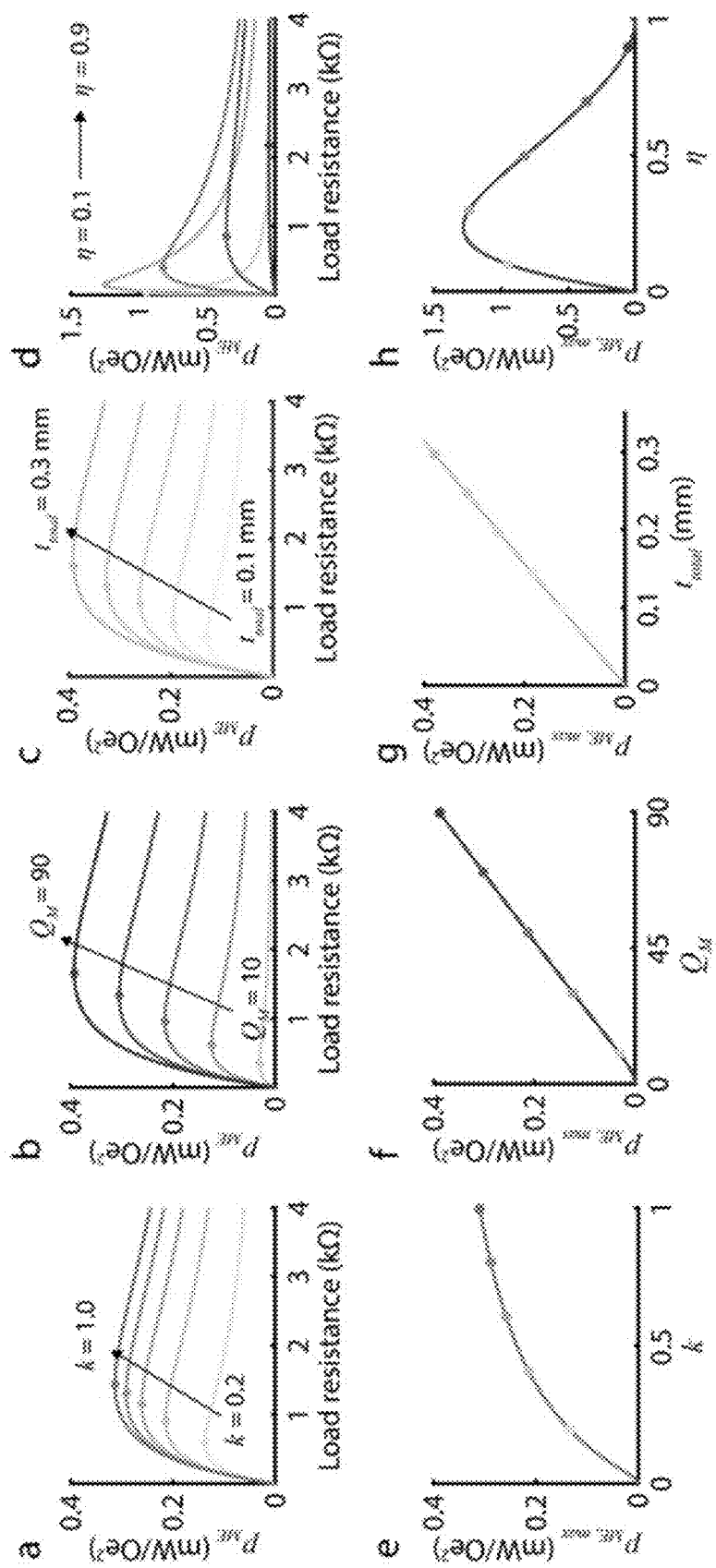
FIGS. 7A-H

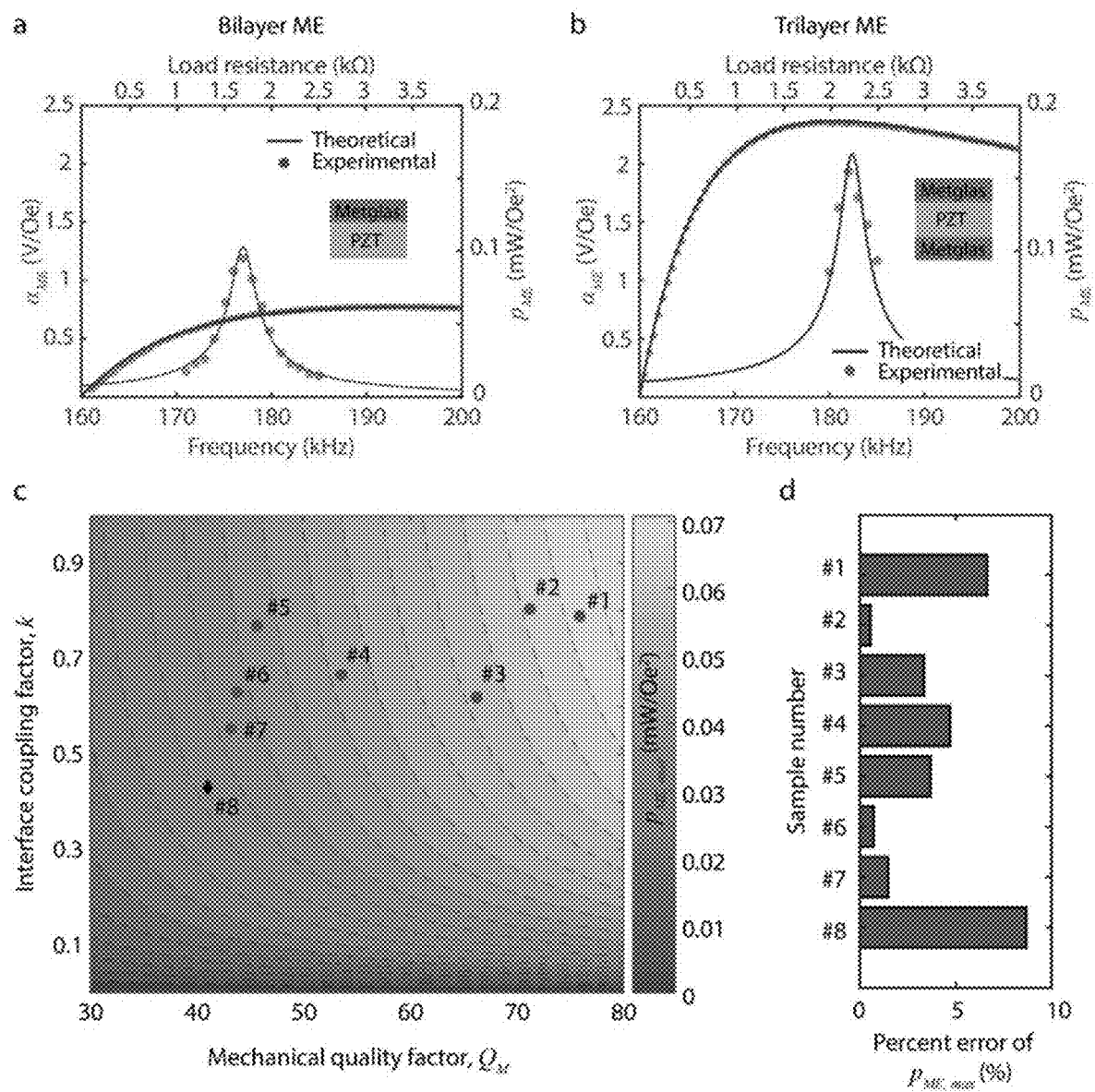
FIGS. 8A-D

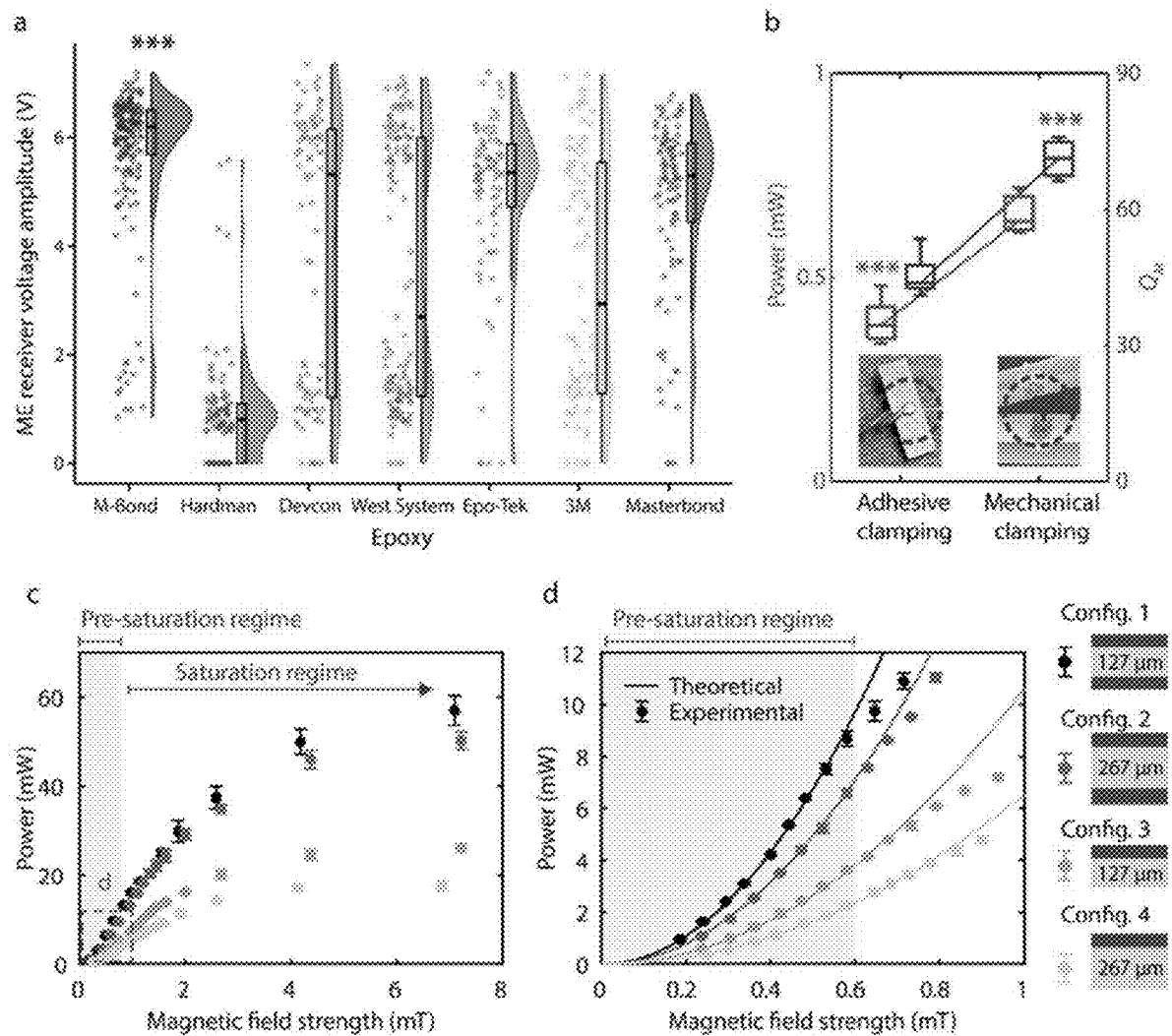
FIGS. 9A-D

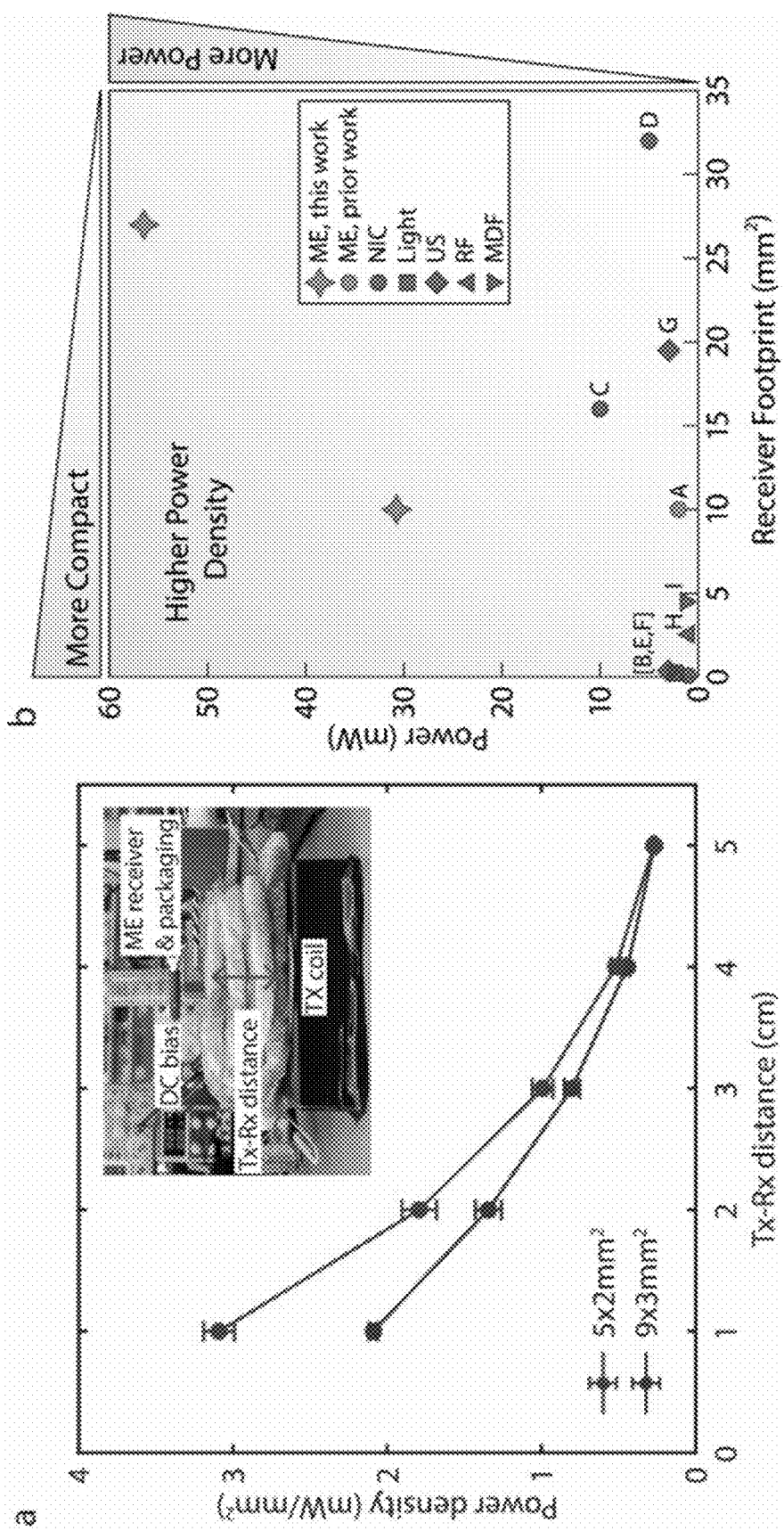
FIGS. 10A-B

IMPLANTABLE BIOELECTRONIC DEVICES BASED ON MAGNETOELECTRIC MATERIAL

CROSS-REFERENCE TO RELATED APPLICATIONS

This application claims the benefit of and the priority to U.S. Provisional Patent Application 63/579,638, filed on Aug. 30, 2023, which is hereby incorporated by reference in its entirety for all purposes.

STATEMENT REGARDING FEDERAL FUNDING

This invention was made with government support under Grant No. U18EB029353 awarded by the National Institutes of Health, Grant No. No. FA8650-21-2-7119 awarded by the Defense Advanced Research Projects Agency and Grant No. 2236422 awarded by the National Science Foundation. The government has certain rights in the invention.

BACKGROUND

Implantable bioelectronic devices, often known as implantable medical devices, can be an instrumental tool in diagnostic and therapeutic healthcare procedures. An implantable bioelectronic device may be used to provide a stimulation therapy that is more tailored and/or more effective for treating a given disorder and/or a given subject (e.g., relative to a conventional pharmaceutical treatment). For example, an implantable medical device may be positioned and used to provide a therapy that is targeted for and delivered to stimulate a specific biological location of interest (e.g., particular axon tract, brain region, organ, etc.). Thus, noise of signals may be reduced when an implantable bioelectronic device is used relative to a device that is positioned on a surface of (or further externally relative to) a person's skin. Similarly, the stimulation may have an effect that is more focused and more effective relative to a pharmaceutical composition.

Some implantable devices (e.g., cardiac pacemakers and deep-brain systems) have been used for stimulation and/or recording devices. However, a given stimulation protocol is highly likely to result in different physiological responses across individuals. Additionally, a given signature of a recorded biological activity may be indicative of different physiological underpinnings and/or different treatment responses across individuals. Therefore, it would be advantageous to control stimulation parameters in a customized manner for specific individuals.

Typically, to implant an implantable device, a surgery is required that includes a deep incision, craniometry, etc. However, recent advances are also utilizing less invasive techniques to introduce an implantable device to a target area, and the implantable devices may be and/or may need to be much smaller than used in years past. For example, a device may be implanted via an endoscopic surgery or intravenously. Some minimally invasive devices are provided to a subject in a manner that does not require an incision.

Further, implanted devices are becoming more sophisticated, in that a given device may include multiple electrodes to provide electrical stimulation and/or multiple electrodes to collect recordings (where some or all of the electrodes providing the stimulation may also collect at least some of the recordings and/or the converse). Consequentially, the amount of data that is to be transmitted and/or received in a given time period has substantially increased. Further yet, more implantable devices are configured to receive frequent signals that can control stimulation signals and/or recording parameters.

Thus, it can take a substantial amount of power to support the operations of an implantable device. Further, the implantable device may be positioned so as to not have connections to provide wireless power, much less wireless power in a sufficient amount and in a real-time manner. As the use cases are expanding in terms of having implantable devices in various body locations and using more sophisticated technology for processing real-time data and sending real-time instructions, the power requirements are also expanding and becoming more complex.

More effective power delivery would allow implanted bioelectronics to support more power-intensive functions, multichannel or multimodal operations, and smaller devices. For example, multichannel neural recording devices typically require up to 2 mW per recording channel and neural stimulation devices typically require up to 21 mW. Increasing the received power can facilitate the addition of more recording or stimulation channels. Similarly, bioelectronic devices have been developed to perform multiple functions simultaneously, enabling the monitoring and control of biological processes in multimodal closed-loop systems. Each additional sensing and recording capability requires additional power. Further, with improved wireless power transfer (WPT), implanted bioelectronics could support their existing functions in a smaller form factor that would allow for less invasive surgical implantation and access to difficult-to-reach targets.

Approaches to transfer power wirelessly to the implantable bioelectronic devices that have been developed face trade-offs regarding depth of penetration, power density, and alignment tolerance. For example, tissue scattering and absorption of both radiofrequency electromagnetic waves and light typically restrict these approaches to shallow implants. For near-field inductive coupling (NIC), power density falls considerably as the devices are miniaturized, making NIC less suitable for small implants. NIC and ultrasound are very sensitive to alignment errors and are therefore difficult to implement in applications that require continuous power. Capacitive coupling and ultrasound require transmitter contact with the body, which is challenging for freely moving applications or continuous operation of implants.

Magnetoelectric (ME) devices may be a promising solution for powering implantable bioelectronic devices compared to other wireless power transfer techniques. The magnetoelectric devices have the potential to deliver higher power to smaller devices with better alignment tolerance and minimal signal attenuation through air or tissue. However, magnetoelectric devices rely on magnetic-field sources (that may be external to the subject within which the magnetoelectric device is implanted), so the magnetoelectric devices may be particularly susceptible to environmental fluctuations, interference, and/or activity within a subject.

Thus, there is a need for improved techniques, methods, and systems to improve the powering implantable devices that can effectively stimulate and/or record physiologically. Such improvements may facilitate effective reduction in the size of implantable bioelectronic devices and improve the performance of implantable bioelectronic devices.

SUMMARY

In some embodiments, a system is provided comprising: a magnetoelectric (ME) component comprising: one or more first layers, where each of the one or more first layers may comprise a piezoelectric material; and one or more second layers, where each of the one or more second layers may comprise a magnetostrictive material, and where a thickness ratio that is defined to be a cumulative thickness of the one or more first layers relative to a cumulative thickness of the one or more second layers is between 0.2 and 0.5.

The magnetostrictive material may include metglas.

The piezoelectric material may include Lead zirconate titanate (PZT).

The system may comprise (e.g., in addition to one or more other parts of the system disclosed herein): an energy harvesting circuit comprising a rectifier circuit, where the energy harvesting circuit is coupled to the ME component. In some instances, the rectifier circuit may include a full-bridge rectifier, and where the energy harvesting circuit may include a power point tracking circuit. The power point tracking circuit may include a maximum power point tracking circuit, and the energy harvesting circuit is configured to present an optimal impedance to the magnetostrictive material across a range of workloads. In some instances, the rectifier circuit may include an active full-bridge rectifier, and where the energy harvesting circuit may include a power point tracking circuit. The power point tracking circuit may include a maximum power point tracking circuit, and the energy harvesting circuit is configured to operate at a maximum power point of the magnetostrictive material regardless of a workload of the system by tracking a half-open-circuit voltage of ME and DC-DC impedance tuning. The energy harvesting circuit may include one or more power point tracking circuits configured to: regulate output voltages for different voltage domains; store excess harvested energy in a storage element; and/or trigger usage of at least part of the stored excess harvested energy upon detecting that power harvested by the energy harvesting circuit is below a threshold.

A storage element disclosed herein and/or used to store energy (e.g., excess energy) may include (for example) a capacitor and/or a battery (e.g., a miniature/micro solid state battery, such as an Ilika® micro solid state battery). In some instances, the battery includes or is a solid state rechargeable battery. A battery such as a solid state rechargeable battery may—in addition to providing extra energy in a delayed manner or in response to surge demand when the films themselves cannot supply sufficient energy-power a lower energy process (e.g., sensing of biological/neural activity) over even hours or days, which may support more continuous data streams even between periods of usage of external power.

The storage element may be configured to store a substantial portion (e.g., at least 25%, at least 50%, or at least 75%) of energy that is received by the storage element at a given time for at least (for example): until a next stimulation and/or recording session. The storage element may be configured to store a substantial portion (e.g., at least 25%, at least 50%, or at least 75%) of energy that is received by the storage element at a given time for at least (for example): 1 minute, 10 minutes, 30 minutes, 1 hour, 3 hours, 6 hours, 12 hours, 1 day, 3 days, 1 week, 3 weeks, 1 month, 3 months, 6 months, or 1 year.

The storage element may be part of the system, external to the system, physically connected to the system and/or electrically connected to the system. The energy harvesting circuit may include a bidirectional dc-dc converter and/or a unidirectional dc-dc converter. The system may be configured to store energy into the storage element when a detected maximum power of the system is larger than a load at a rectifier of the energy harvesting system.

The system may comprise (e.g., in addition to one or more other parts of the system disclosed herein) an open-circuit voltage sampler. The open-circuit voltage sampler may be configured to sample magnetoelectricity at a beginning of a power transfer phase to the system.

The system may be or may include an implantable bioelectronic device.

The system may be or may include a batteryless implant.

A total thickness of the implantable bioelectronic device may be less than 1 mm.

The system may comprise (e.g., in addition to one or more other parts of the system disclosed herein) one or more electrodes configured to record electrical signals.

The system may comprise (e.g., in addition to one or more other parts of the system disclosed herein) a capacitor; and a switching circuit, where the switching circuit is configured to dynamically change a connection with a capacitor.

The system may comprise (e.g., in addition to one or more other parts of the system disclosed herein) a battery (e.g., a miniature/micro solid state battery, such as an Ilika® micro solid state battery); and a switching circuit, where the switching circuit is configured to dynamically change a connection with the battery. A battery such as a solid state rechargeable battery may—in addition to providing extra energy in a delayed manner or in response to surge demand when the films themselves cannot supply sufficient energy—power a lower energy process (e.g., sensing of biological/neural activity) over even hours or days, which may support more continuous data streams even between periods of usage of external power.

The system may comprise (e.g., in addition to one or more other parts of the system disclosed herein) a low noise amplifier.

A mechanical coupling of a first layer of the one or more first layers and a second layer of the one or more second layers may be configured to have an interface coupling factor between 0.42 and 0.70. A mechanical quality factor of the system may be between 43.2 and 75.9. A thickness of the one or more second layers may be between 20 mm and 30 mm. A thickness of the one or more first layers may be between 100 mm and 150 mm. A thickness ratio of a cumulative thickness of the one or more first layers relative to a sum of the one or more first layers and the one or more second layers may be between 0.70 and 0.95.

The system may comprise (e.g., in addition to one or more other parts of the system herein) a power or energy source configured to supply power or energy (e.g., potentially dynamically) to another portion of the system. For example, the power or energy source may be configured to be positioned to be external to a subject, while the magnetoelectric component, energy harvesting circuit and/or power point tracking circuit may be part of an implantable device configured to be implanted in a body of the subject (e.g., a brain, heart, lung, other organ, vessel, etc.) of the subject.

In some embodiments, a method of powering or energizing a device disclosed herein or system disclosed herein is provided. Such a device or system may include one or more configuration properties disclosed herein, one or more components disclosed herein, one or more operation capabilities or properties disclosed herein, one or more specifications disclosed herein, etc.

In some embodiments, part or all of a system disclosed herein may provide stimulation to an organ, vessel, etc. and/or to record one or more types of biological signals. The power or energy that is being delivered to a magnetoelectric component of the system may depend on various factors (e.g., a prior, recent, or instantaneous: noise, signal strength, position of an implantable device of the system, stimulation protocol, movement of a subject, symptom strength/presence of a subject, etc.) that may be detected or inferred by the system or by another system, The terms and expressions which have been employed are used as terms of description and not of limitation, and there is no intention in the use of such terms and expressions of excluding any equivalents of the features shown and described or portions thereof, but it is recognized that various modifications are possible within the scope of the invention claimed. Thus, it should be understood that although the present invention as claimed has been specifically disclosed by embodiments and optional features, modification and variation of the concepts herein disclosed may be resorted to by those skilled in the art, and that such modifications and variations are considered to be within the scope of this invention as defined by the appended claims.

BRIEF DESCRIPTION OF THE DRAWINGS

The patent or application file contains at least one drawing executed in color. Copies of this patent or patent application publication with color drawing(s) will be provided by the Office upon request and payment of the necessary fee.

The present disclosure is described in conjunction with the appended figures:

FIGS. 6A-H illustrate relationships between the ME voltage coefficient ($\alpha_{ME}$) and various variables based on the theoretical model disclosed herein. Panels (a-d) show $\alpha_{ME}$ as a function of frequency for varying (a) k, (b) $Q_M$, (c) $t_{total}$, and (d) η, which are ME material properties that can be controlled during fabrication and clamping. Panels (e-h) illustrate relationships between the maximum ME voltage coefficient ($\alpha_{ME,max}$) and each of k, $Q_m$ $t_{total}$ and η.

FIGS. 7A-H illustrate relationships between ME power coefficient ($p_{ME}$) and various variables based on our theoretical model disclosed herein. Panels (a-d) show $p_{ME}$ as a function of load resistance for varying (a) k, (b) $Q_M$, (c) $t_{total}$, and (d) η. Panel (e-h) shows the maximum ME power coefficient ($P_{ME,max}$), which can be calculated from Eq. 6, as a function of (e) k, (f) $Q_M$, (g) $t_{total}$, and (h) η.

FIGS. 8A-D illustrate experimental validation of the equivalent circuit model of ME WPT for both bilayer and trilayer configurations and for different mechanical properties of the ME receiver. Experimental measurements (circles) for $\alpha_{ME}$ (red) and $p_{ME}$ (blue), show close agreement with the theoretical values (solid lines) calculated from the model for (a) bilayer (Metglas-PZT) ME receivers and (b) trilayer (Metglas-PZT-Metglas) ME receivers. (c) The 2D contour plot shows theoretical values of $p_{ME,max}$ for varying $Q_M$ and k. Red circles represent data we collected in this study using bilayer ME receivers, and a black diamond represents data from our group's previous work28. (d) The percent error $$\left(\frac{|\text{theoretical} - \text{experimental}|}{\text{experimental}} \times 100\%\right)$$

Figure 1:
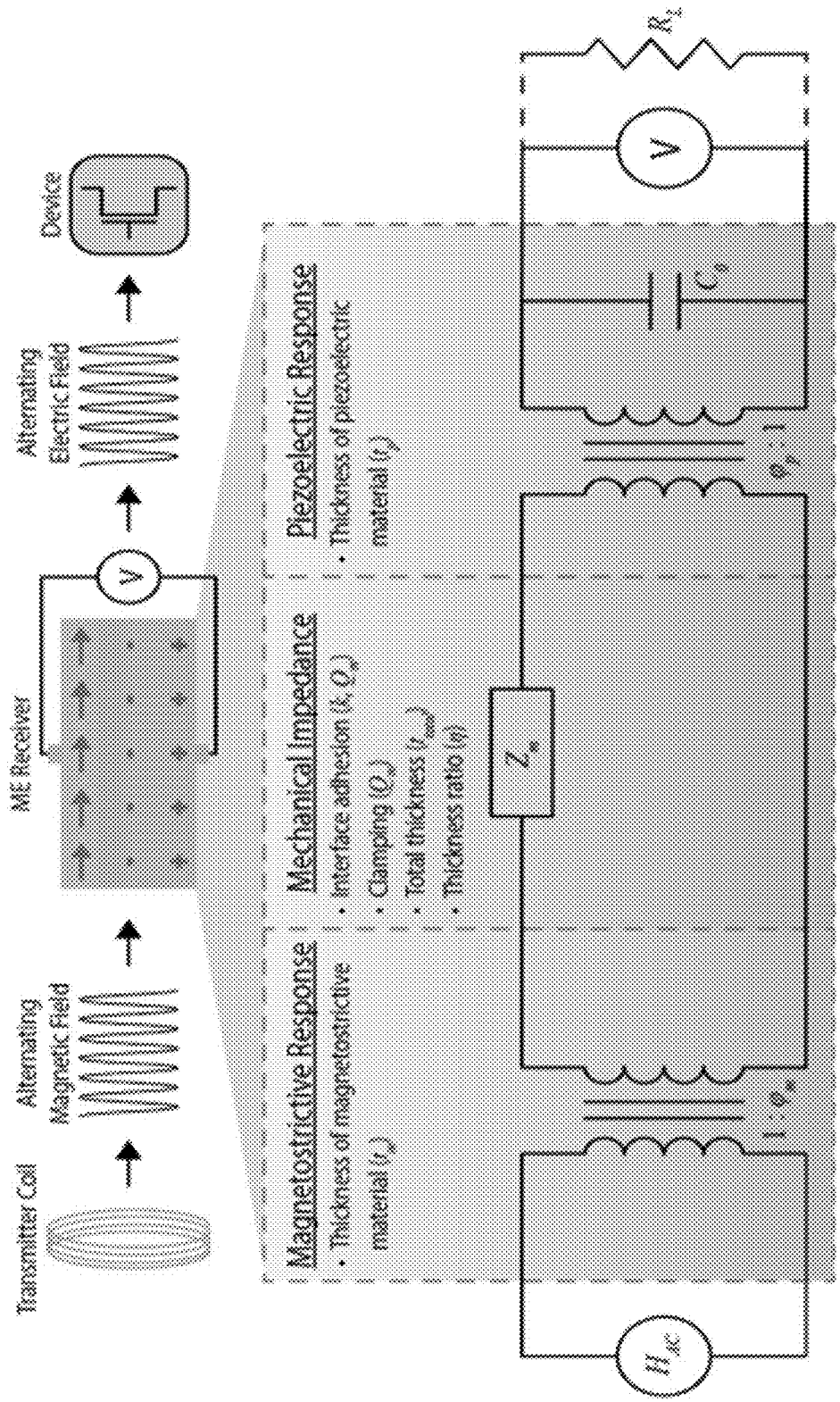
FIG. 1 depicts an illustrative system associated with a mechanism and equivalent circuit model that implements the use of magnetoelectric (ME) wireless power transfer (WPT).

of the theoretical $p_{ME,max}$ is less than 9% for all samples.

FIGS. 9A-D shows plot illustrating optimization of interface adhesion, clamping, and the thickness of each layer for increased power. (a) ME receiver performance for seven different epoxies (n≥90 for each). M-Bond epoxy results in a higher voltage amplitude compared to all other epoxies (***p<0.001 for all pairs via Wilcoxon rank sum test). (b) Comparison of power and $Q_M$ using two different clamping methods: adhesive clamping and mechanical clamping. (c) Measured power from four different ME receiver configurations (config. 1-4, n=3 for each) as a function of magnetic field strength. (d) Magnified version of (c) from 0-1 mT. Different shades denote different configurations.

FIGS. 10A-B illustrates data for configured ME receivers demonstrated through ex vivo porcine tissue and compared to other WPT technology. (a) Measured power density in two different sizes of ME receivers as a function of distance through tissue (n=3 for each size). (b) Comparison of configured ME receivers to previously reported mm-sized bioelectronics wirelessly powered by ME [A], near-field inductive coupling (NIC) [B-D], light [E], ultrasound [F, G], radiofrequency electromagnetic waves (RF) [H], and midfield inductive coupling (MDF) [I]. Compared to a 16-mm² NIC-powered device (C), we achieved over 4 times larger power density and 5 times larger power.

DETAILED DESCRIPTION

While magnetoelectric (ME) materials have been explored for compact antennas, only recently have ME materials been used for WPT in bioelectronics, demonstrating up to 2 mW of power delivery. The ME receivers most commonly used to power bioelectronics are multilayer laminates that convert magnetic energy into electrical energy through mechanical coupling between magnetostrictive and piezoelectric layers. This conversion is most efficient when the frequency of the magnetic field matches an acoustic resonant frequency of the ME receiver, thereby generating the maximum voltage and power.

Because ME performance depends on several material properties and this WPT approach is relatively new in bioelectronics, techniques of the present invention relate to systems and methods to increase the power density of ME receivers based on their material properties. It will be appreciated that some approaches aim to improve ME performance by optimizing ME material properties. Such approaches may be primarily focused on (for example) increasing voltage generated by cm-scale ME receivers in sub-mT-scale magnetic fields, making these findings less applicable to WPT in implantable bioelectronics. Some embodiments disclosed herein relate to configuring ME material properties to improve the power transfer to mm-scale ME receivers in mT-scale magnetic fields.

In some embodiments, a system is provided that includes one or more magnetoelectric materials for powering an implantable bioelectronic device wirelessly, thereby delivering higher power with alignment tolerance and low signal attenuation. A magnetostrictive layer of the system can generate an alternating magnetic field that is converted to elastic excitation through a magnetostrictive response. The elastic excitation can be converted into an electric field through a piezoelectric response affected by a piezoelectric layer. As a result, the electric field generated during this process can be used to wirelessly power the implantable bioelectronic device. Thus, the system utilizing the one or more magnetoelectric materials may act as an energy harvesting source that renders high power delivery to one or more other devices (such as the implantable bioelectronic device).

The implantable bioelectronic device may include one or more layers of a magnetoelectric (ME) material coupled to an energy harvesting circuit. The one or more layers of the magnetoelectric material may be configured to generate an alternating magnetic field. The generated magnetic field may facilitate elastic excitation based on a magnetostrictive response. The magnetostrictive response may include a change in a shape or dimension of the one or more layers of the magnetoelectric material during a magnetizing process. The elastic excitation may further or alternatively be converted into an electric field based on a piezoelectric response by a piezoelectric layer. The resultant electric field may be used to support one or more power-supported functions, which may include multichannel or multimodal operations.

FIG. 1 depicts an illustrative system associated with a mechanism and equivalent circuit model that implements the use of magnetoelectric (ME) wireless power transfer (WPT). In the representation depicted in FIG. 1, the voltage coefficient ($\alpha_{ME}$), which is defined as the ratio of the change in the receiver's open-circuit voltage (OCV) to the change in the applied magnetic field, is used as an intermediate term to calculate the power. (Eqn. 1—where V is the OCV from the ME receiver and $H_{ac}$ is the applied alternating magnetic field.)

$$\alpha_{ME} = \left| \frac{dV}{dH_{ac}} \right| \qquad \text{Eqn. 1}$$

Based on the equivalent circuit model, $\alpha_{ME}$ can be defined in terms of the magneto-elastic and electro-elastic coupling factors ($\varphi_m$ and $\varphi_p$, respectively), the equivalent mechanical impedance ($Z_M$), and the load impedance ($Z_L$). (Eqn. 2.)

$$\alpha_{ME} = \left| \frac{Z_L \varphi_m \varphi_p}{Z_M + Z_L \varphi_p^2} \right|. \qquad \text{Eqn. 2}$$

The magneto-elastic coupling factor ($\varphi_m$) relates the transfer of the applied magnetic field to the elastic excitation in the magnetostrictive layer (FIG. 1, green) and depends on the width (W), magnetostrictive layer thickness ($t_m$), magneto-elastic compliance represented by tensor element $s_{33,m}$, and piezomagnetic modulus represented by the tensor element $d_{33,m}$.

As shown in the green highlighted portion of FIG. 1, a transmitter coil generates an alternating magnetic field that is converted into elastic excitation through a magnetostrictive response in a magnetostrictive layer of a magnetoelectric device. The magnetoelectric device may correspond to a multi-layer laminate structure including a bilayer laminate structure with at least one magnetostrictive layer and at least one piezoelectric layer, or a trilayer laminate structure with one or more magnetostrictive layers and at least one piezoelectric layer between the one or more magnetostrictive layers. Additionally and/or alternatively, the magnetoelectric device may include one or more layers of magnetoelectric material with mechanical properties that vary across at least two layers and/or across one, more or all adjacent layers. The bilayer or trilayer laminate structure of the magnetoelectric device may correspond to and/or include a material such as: Terfenol-Lead zirconate titanate (PZT)/lead magnesium niobate-lead titanate (PMN-PT), Metglas-Lead zirconate titanate (PZT)/lead magnesium niobate-lead titanate (PMN-PT), Metglas-Lithium niobate, etc.

Further, as illustrated in the purple highlighted portion of FIG. 1, a piezoelectric response generated by a piezoelectric device may facilitate a conversion of the elastic excitation into an electric field. The piezoelectric device may include one or more layers of a piezoelectric material. The piezoelectric device may include one or more layers of piezoelectric material including lead zirconate titanate (PZT), lead magnesium niobate-lead titanate (PMN-PT), Lithium niobate, etc. In some embodiments, the at least one piezoelectric layer may correspond to the piezoelectric device.

In the equivalent circuit model as depicted in FIG. 1 (an as noted above), $H_{ac}$ is the output of a current source that represents an amplitude of the applied alternating magnetic field, $\varphi_m$ and $\varphi_p$ are magneto-elastic and electro-elastic coupling factors, respectively. Thus, the electro-elastic coupling factor (Pp) relates the transfer of the mechanical stress to the electric excitation in the piezoelectric layer. Further, $\varphi_p$ depends on the width (W), electro-elastic compliance represented by the tensor element $s_{11,p}$, and piezoelectric modulus represented by the tensor element $d_{31,p}$. $Z_M$ is the equivalent mechanical impedance and depends on factors such as the interface coupling between the layers of the laminate (k); mechanical quality factor ($Q_M$), which is a measurement of strain amplification in ME receiver; total thickness ($t_{total}$); and thickness ratio ($\eta$), which is the ratio of the PZT thickness to total thickness. The load impedance ($Z_L$) depends on the resistive load that receives the power and the capacitance of the piezoelectric layer, and $C_0$ is the capacitance of the piezoelectric material, V is the voltage difference across the magnetoelectric device, and $R_L$ is the load resistance.

As shown in the blue highlighted portion of FIG. 1, a mechanical impedance may be controlled to signify losses in the elastic excitation. The mechanical impedance may be controlled based on one or more parameters, such as an interface adhesion and/or an interface coupling factor (k), clamping, total thickness of the magnetoelectric device ($t_{total}$), and thickness ratio of the magnetoelectric device ($\eta$). The elastic excitation may be associated with a thickness of the magnetostrictive layer, which may be expressed as ($t_m$) and the conversion between the elastic excitation and the electric field may be associated with a thickness of the piezoelectric material, which may be expressed as ($t_p$), such as in a manner as illustrated by the equation in FIG. 2.

Figure 2:
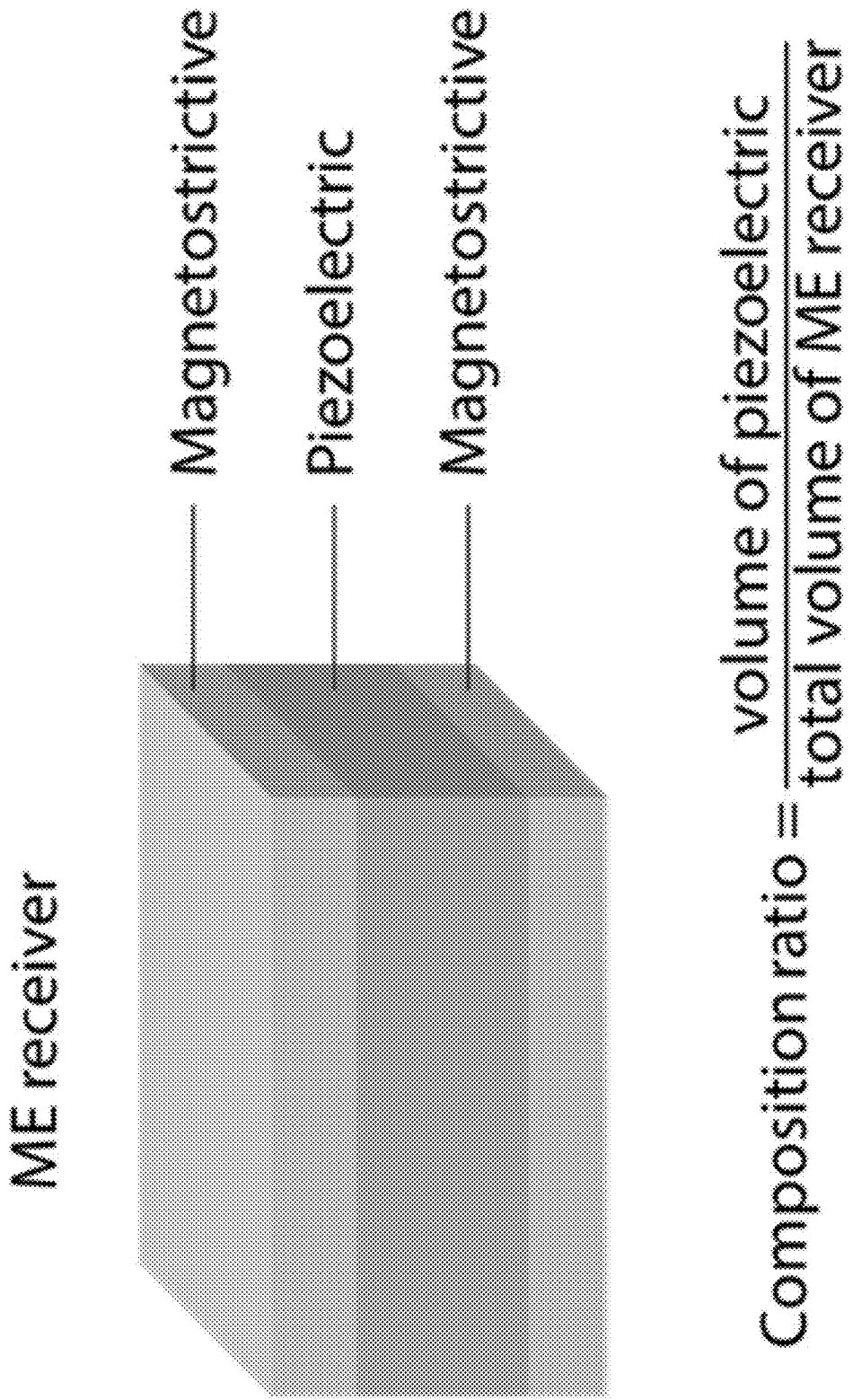
FIG. 2 depicts an exemplary arrangement of one or more layers in the magnetoelectric device, according to some embodiments of the present invention.

FIG. 2 depicts an exemplary arrangement of the one or more layers in the magnetoelectric device, according to an embodiment of the present invention. The magnetoelectric device and/or receiver may correspond to the multi-layer laminate structure including at least one piezoelectric layer (for e.g., lead zirconate titanate (PZT) layer) between one or more magnetostrictive layers (for e.g., one or more layers of metglas).

One or more properties may be controlled and optimized in order based on a predicted induced voltage and/or power in the magnetoelectric device (and/or to improve an induced voltage and/or power). The one or more properties may include (for example): a thickness ratio and/or a composition ratio of the magnetoelectric device ($\eta$), interface coupling factor (k), a mechanical quality factor ($Q_M$), a thickness of the magnetostrictive layer ($t_m$), a thickness of the piezoelectric material ($t_p$), and/or a total thickness of the magnetoelectric device ($t_{total}$).

For example, a composition ratio and/or a thickness ratio of the magnetoelectric device ($\eta$) can be expressed in terms of the thickness of the piezoelectric layer ($t_p$) divided by a total thickness ($t_{total}$) of the magnetoelectric device. The total thickness of the magnetoelectric device may be related to an overall thickness including the thickness of the piezoelectric layer ($t_p$) and the thickness of the one or more magnetoelectric layers ($t_m$). The total thickness ($t_{total}$) of the magnetoelectric device may be at least (for example): 140 µm or 0.140 mm, 145 µm or 0.145 mm, 148 µm or 0.148 mm, 149 µm or 0.149 mm, 150 µm or 0.15 mm, to at least 319 µm or 0.319 mm, 318 µm or 0.318 mm, or 317 µm or 0.317 mm, etc. The total thickness ($t_{total}$) of the magnetoelectric device may be less than (for example) 1000 µm or 1 mm, 500 µm or 0.5 mm, 450 µm or 0.450 mm, to at least 400 µm or 0.400 mm, 350 µm or 0.350 mm, or 325 µm or 0.325 mm, etc. In some embodiments, the total thickness ($t_{total}$) of the magnetoelectric device may be between 150 µm or 0.15 mm to 317 µm or 0.317 mm. A composition ratio and/or thickness ratio of the multi-layer laminate structure may be less than (for example): 0.2, 0.25, 0.3, 0.4, 0.5, etc. and/or may be greater than (for example): 0.30, 0.25, 0.20, 0.15, 0.10 0.08, etc. In some embodiments, the composition ratio and/or the thickness ratio of the multi-layer laminate structure may be between 0.2 and 0.5.

The thickness of the piezoelectric material ($t_p$) may be at least (for example): 121 µm or 0.121 mm, 122 µm or 0.122 mm, 124 µm or 0.124 mm, 127 µm or 0.127 mm, etc. and/or may be less than (for example): 261 µm or 0.261 mm, 262 µm or 0.262 mm, 264 µm or 0.264 mm, 267 µm or 0.267 mm, etc. In some embodiments, the thickness of the piezoelectric material ($t_p$) may be (for example) between 127 µm or 0.127 mm and 267 µm or 0.267 mm. The thickness of the magnetostrictive material ($t_m$) may be greater than (for example): 20 µm or 0.20 mm; 25 µm or 0.25 mm; 30 µm or 0.30 mm; etc.

The thickness of the magnetoelectric material ($t_m$) may be at least (for example): 25 µm or 0.25 mm; may be may be less than (for example): 200 µm or 0.200 mm, 150 µm or 0.150 mm, 100 µm or 0.100 mm, 50 µm or 0.50 mm, 45 µm or 0.45 mm, 30 µm or 0.30 mm, etc. and/or may be less than (for example): 100 µm or 0.10 mm, 75 µm or 0.075 mm, 50 µm or 0.050 mm, 300 µm or 0.030 mm, etc.

It will be appreciated that, as referred to herein, the "thickness of" the piezoelectric material or magnetoelectric material may refer to a cumulative, maximum, median, mean, mode across all layers in the system having the corresponding material across any or all layers.

In some embodiments, the thickness of the magnetoelectric material ($t_m$) may be (for example) between 127 µm or 0.127 mm and 267 µm or 0.267 mm. The thickness of the magnetostrictive material ($t_m$) may be greater than (for example): 20 µm or 0.20 mm; 25 µm or 0.25 mm; 30 µm or 0.30 mm; etc.

The mechanical quality factor ($Q_M$) may be greater than (for example): 35, 38, 40, 41 42, 43, 44, 44.4, 45, 47, 50, etc. and/or less than (for example): 85, 80, 79, 78, 77.1, 77, 76, 75.9, 75, 74.7, 70, 65, etc. The mechanical quality factor may be influenced and/or based on (for example) one or more interface adhesion techniques and/or clamping mechanism(s). As such, the mechanical quality factor ($Q_M$) may be associated with a strain amplification factor of the magnetoelectric device.

The interface coupling factor (k) may be at least (for example): 0.25, 0.3, 0.35, 0.37, 0.38, 0.40, 0.42, 0.44, 0.46, 0.48, 0.50, etc. and/or less than (for example: 0.8, 0.78, 0.76, 0.74, 0.72, 0.70, 0.68, 0.66, 0.64, 0.6, etc. In some instances, the interface coupling factor is between 0.38-0.74, 0.42-0.70, or 0.46-0.66. The interface coupling factor may be influenced and/or based on the interface adhesion techniques and/or clamping mechanism(s). As such, the interface coupling factor (k) may be related to coupling between the one or more magnetostrictive layers and at least one piezoelectric layer. The overall packaging, including the interface adhesion and clamping mechanism between the one or more layers, may affect factors such an interface coupling factor (k), a mechanical quality factor ($Q_M$), etc. In some embodiments, the clamping mechanism may affect the mechanical quality factor ($Q_M$). During the fabrication of the magnetoelectric device, the one or more properties may be controlled and optimized within the ranges to improve induced voltage and power in the small-scale magnetoelectric device.

As such, the one or more properties and the associated thresholds and/or ranges may be related to each other due to one or more common attributes. For instance, the interface adhesion and clamping mechanism may affect one or both of the coupling factor (k) and a mechanical quality factor ($Q_M$). As another example, the thickness of the piezoelectric material ($t_p$) may affect (for example) the total thickness and/or the composition ratio of the magnetoelectric device.

Adaptive Magnetoelectric Wireless Power Receiving Electronic Circuits

Figure 3:
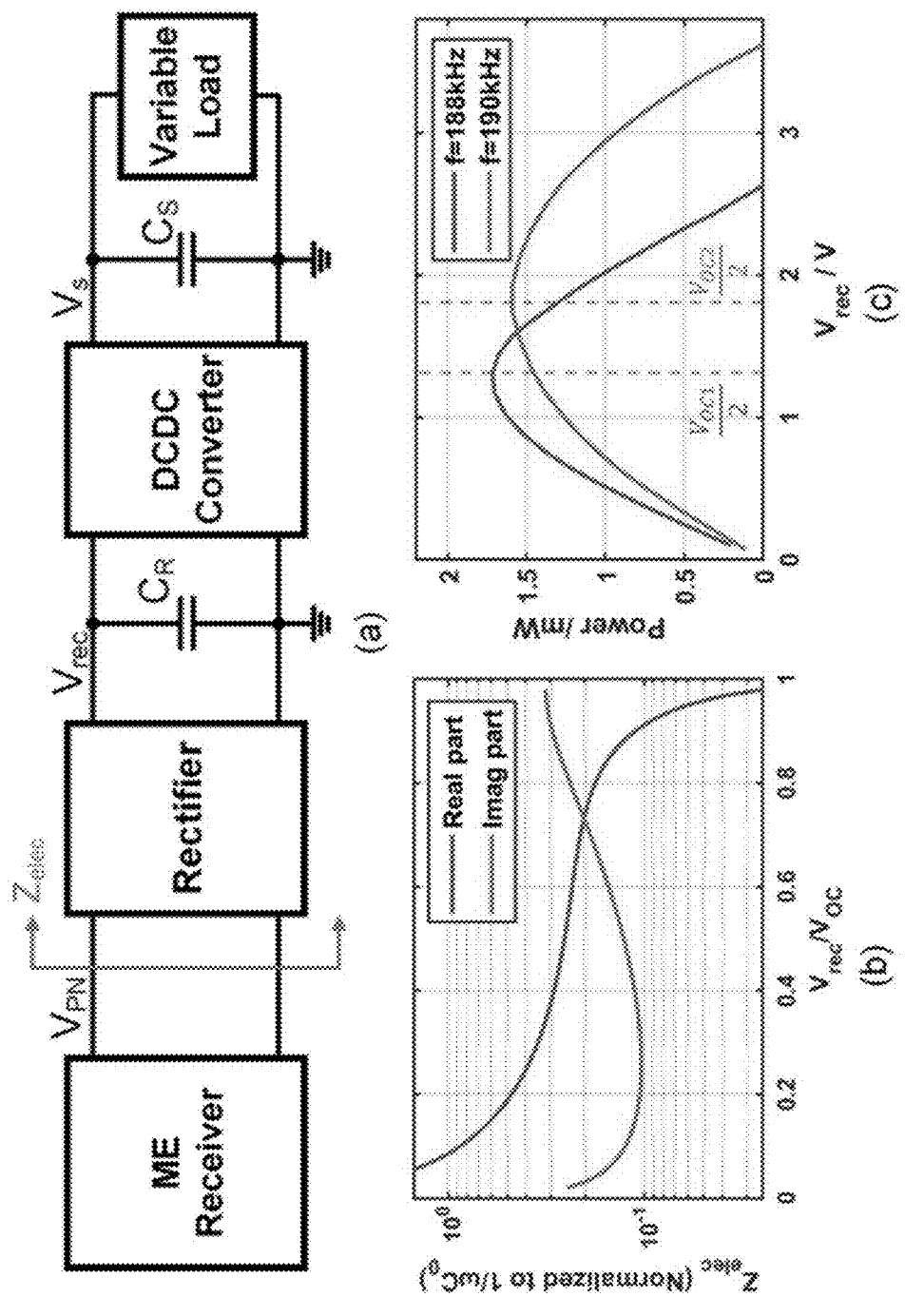
FIG. 3 illustrates adaptive magnetoelectric power receiving circuitry and relationships in accordance with some embodiments of the invention: (a) circuit diagram; (b) Electrical impedance ($Z_{elec}$) as a function of the ratio between rectifier's output voltage ($V_{rec}$) and magnetoelectric receiver's open-circuit voltage ($V_{OC}$); (c) Output power as a function of the rectifier's output voltage at different frequencies.

In order to extract a large amount (e.g., ideally the maximum amount) of power from a given magnetoelectric transducer, the electrical impedance ($Z_{elec}$) presented by the energy harvesting circuit can be dynamically set to attempt to match the magnetoelectric receiver's impedance. The electrical impedance $Z_{elec}$ can be tuned by changing the output voltage of the rectifier. FIG. 3(a) shows an exemplary circuit to perform adaptive impedance matching.

Results from a simulation show that, for a magnetoelectric receiver operating at a given frequency, the output power will peak when rectifier's output voltage is around half of the open-circuit voltage ($V_{OC}/2$) regardless of the operating frequency. (FIG. 3(c).) Therefore, maximum power point tracking (MPPT) can be achieved by employing a DCDC converter to regulate the output voltage of rectifier to be $V_{OC}/2$. The DCDC converter can isolate the variable load from the magnetoelectric receiver and hence enable a load-independent power at the rectifier's output.

Figure 4:
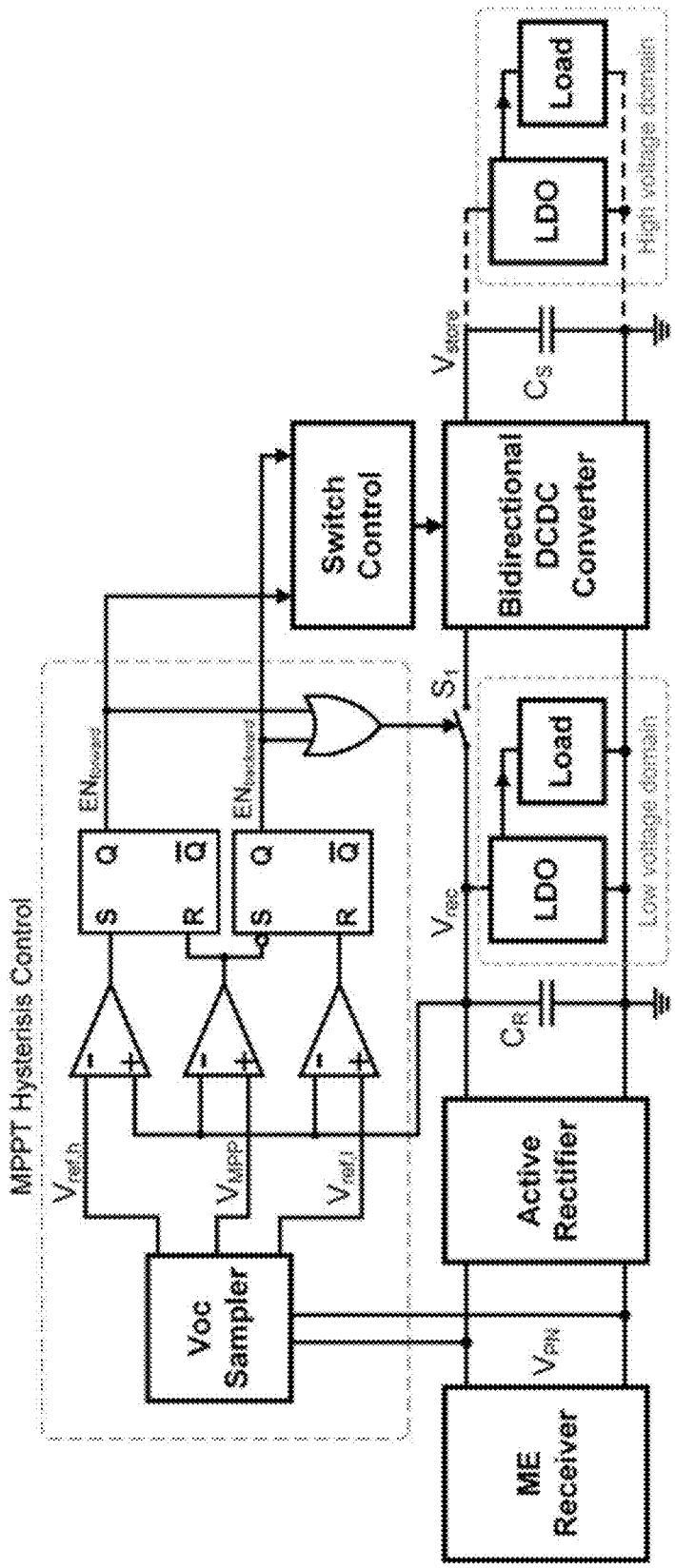
FIG. 4 illustrates a diagram of an exemplary implementation of a magnetoelectric power harvesting circuit in accordance with some embodiments of the invention.

FIG. 4 illustrates one implementation of a magnetoelectric power harvesting circuit with adaptive magnetoelectric wireless power transfer capabilities. The magnetoelectric power harvesting circuit comprises an active rectifier, a DCDC converter, and various control circuits. To facilitate MPPT control, the output voltage of the rectifier ($V_{rec}$) is regulated within a voltage window ($V_{ref,l}$ to $V_{ref,h}$) centered around the maximum power point voltage ($V_{MPP}$) using the DCDC converter. When $V_{rec}$ exceeds $V_{ref,h}$, the DCDC is enabled in forward direction to extract power from $C_R$, thereby reducing $V_{rec}$. When $V_{rec}$ drops below $V_{MPP}$, the DCDC is deactivated so that charge will accumulate on $C_R$ and $V_{rec}$ will increase. In this way, the output power is maintained at peak point and excess energy is stored on the storage capacitor $C_S$ (and/or another type of storage element, such as a battery). The energy in $C_S$ can be used to supply various applications such as neural stimulation, which often requires a high voltage and sufficient instantaneous power. The battery may include (for example) a miniature/micro solid state battery, such as an Ilika® micro solid state battery. A battery such as a solid state rechargeable battery may—in addition to providing extra energy in a delayed manner or in response to surge demand when the films themselves cannot supply sufficient energy—power a lower energy process (e.g., sensing of biological/neural activity) over even hours or days, which may support more continuous data streams even between periods of usage of external power.

As an example, a system disclosed herein may include a battery and configuration such that external power may be used to deliver bioelectric therapy and such that excess energy is harvested to charge a battery (e.g., where the battery is within an implantable device of the system that delivers the bioelectric therapy; and/or where the battery is a solid state battery). After external power is removed, the system may use the battery to perform periodic sensing of bioactivity (e.g., of neural activity). The periodic sensing may be assessed within the system or externally from the system to predict a current or future response of a response of a subject (or of a portion of a subject's body, such as a response of a given organ or portion of a given organ) to the bioelectric therapy. For example, the periodic sensing may be assessed to predict a neural response within a particular region of a brain of the subject over the coming hours or coming days.

Moreover, some disclosed embodiments support bidirectional energy transfer, enabling the system to supply power from the storage capacitor (and/or other type of storage element) to the load in the event of a substantial load surge. When $V_{rec}$ falls below $V_{ref,l}$, the DCDC is activated in the reverse direction, refilling $C_R$ and maintaining $V_{rec}$ near $V_{MPP}$. The system can store surplus energy into the storage capacitor ($C_S$) (and/or into another type of storage element) when magnetoelectric's maximum power ($P_{MPP}$) is larger than load at the rectifier's output (in the low voltage domain). Conversely, the system allows drawing energy from the storage when an instantaneous load power exceeding $P_{MPP}$ occurs. The bidirectional DCDC converter can be substituted with an unidirectional DCDC if the load is anticipated to be consistently lower than $P_{MPP}$. The open-circuit voltage ($V_{OC}$) sampler samples magnetoelectric $V_{OC}$ at the beginning of the power transfer phase, enabling the acquisition of $V_{MPP}$, $V_{ref,l}$ and $V_{ref,h}$ for the DCDC control.

Figure 5:
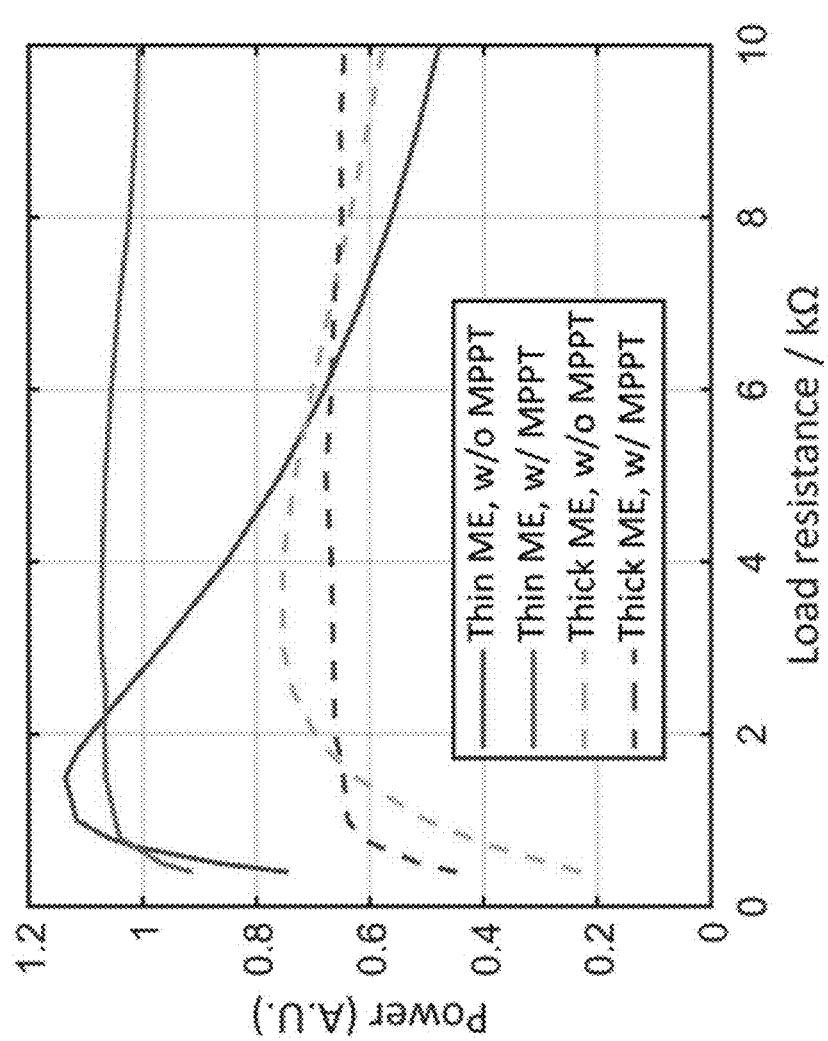
FIG. 5 illustrates relationships between output power from thin and thick magnetoelectric transducers, with and without the MPPT magnetoelectric wireless power transfer interface.

As illustrated in FIG. 5, simulation results demonstrate that the adaptive MPPT power receiver allows both thin and thick magnetoelectric receivers to consistently maintain high output power levels across a wide range of loads. There is a slight deviation in MPPT power from the ideal peak power of the magnetoelectric receiver, owing to the limited DCDC power conversion efficiency. Nevertheless, the technology exhibits a significant power enhancement in a full system with varying and light load conditions.

The system may further include a transmitter and potentially a receiver (which may be a single transceiver). The transmitter can be configured to communicate data to a computing device that is part of the system. The computing device may be a device operated by the subject, by a medical provider associated with treating the subject, or an entity facilitating medical monitoring or treatment for the subject. Such communication can occur using any of a variety of commercially available protocols, such as a wireless network, including a short-range connection (e.g., a Bluetooth, BTLE or ultra-wideband connection) or over a WiFi network, such as the Internet, etc. A receiver may be configured to receive an instruction or request from a computing device, such as an instruction to begin recording signals or a request to send data to the computing device.

The system may further include a processing component that may perform initial processing using the signals. One or more initial processing actions may instead or additionally be performed at the computing device to which the signals are transmitted. The computing device may include a mobile device (e.g., a smart phone), a tablet, a laptop, a desktop computer, a computer server, etc.

The power generated based on the electric field may be used to power implantable bioelectronic devices. The power generated based on the electric field may be transmitted to one or more energy harvesting circuits. The power generated based on the electric field may be transmitted to one or more circuitry corresponding to a full-bridge rectifier and optimal load resistance, a full-bridge rectifier with maximum power point tracking circuit, dc-dc converter, and wide range of load resistance, a full-bridge rectifier with maximum power point tracking circuit, bidirectional dc-dc converter, wide range of load resistance, instant load power larger than magnetoelectric device's maximum power, etc.

The system may include a magnetoelectric (ME) transducer and/or one or more electrodes. The one or more electrodes may be coupled to one or more circuits disclosed herein through ME transducer. The circuit (for example) may be configured to avail power from the ME transducer, transmit sensing data collected via a second pair of electrodes and/or receive data from the external transceiver.

In some instances, an electrode of a first pair of electrodes is attached to an outer surface of the magnetostrictive material and another electrode of the first pair of electrodes is attached to an outer surface of the piezoelectric material. The system may also or alternatively include a low noise amplifier (LNA) (e.g., with a fixed gain) configured to amplify weak electrical signal from the ME transducer and generate a consistent response for measuring signal strength. To modulate the ME transducer during an uplink communication, a switching circuit may be configured that may electrically connect and disconnect a storage element based on the sensing data collected via the sensing electrodes.

The implantable bioelectronic devices may be associated with the treatment of neurological disorders. The power generated based on the electric field may be used to power the implantable bioelectronic devices. For instance, a subject may be diagnosed with one or more neurological disorders including, such as a cognitive disorder, an attention disorder, a movement disorder, a sensory disorder, etc. The subject may show one or more neurological symptoms, such as reduced cognitive function, reduced attention capability, motor impairment, etc.

The implantable bioelectronic devices may be introduced in the subject's body by a minimally invasive medical procedure. The power generated by the magnetoelectric device and/or supplied by the one or more energy harvesting circuits may facilitate computing functions, such as physiological data capturing, stimulation of one or more channels, monitoring of physiological and biological processes, tissue health monitoring, etc. The implantable bioelectronic devices may facilitate additional sensing and recording capabilities based on the wireless power transfer. The implantable bioelectronic devices may support the existing functionalities within facilitate additional sensing and recording capabilities in a smaller form factor that would allow for less invasive surgical implantation and access to difficult-to-reach targets in a subject.

In some embodiments, the system may further include a symptom monitoring system that can communicate with the implantable bioelectronic device to monitor biological, physiological and/or behavioural information pertaining to a subject. For example, the intelligent symptom monitoring system may include a user device (e.g., mobile phone) or wearable user device (e.g., smartwatch) or an application installed on the (wearable) user device. The (wearable) user device can include one or more sensors that may be configured to detect signals corresponding to motor activity, physiological metrics, biometric information, etc, of the subject. For example, the user device may include an accelerometer and/or gyroscope that can be used to collect signals that can be processed to estimate one or more types of movement.

In some embodiments, the implantable bioelectronic device can be configured to stimulate a general region or an axon-bundle track. The stimulation may be in the subthalamic region, medial forebrain bundle, central median thalamus, internal capsule, dentate gyrus, prefrontal cortex, etc. Based on the communication between the computing system and the symptom monitoring system, the implantable bioelectronic device may perform a desired operation to improve the subject's condition.

EXAMPLES

The following examples are included to demonstrate preferred embodiments. It should be appreciated by those of skill in the art that the techniques disclosed in the examples that follow represent techniques discovered by the inventor to function well in the practice of embodiments, and thus can be considered to constitute preferred modes for its practice. However, those of skill in the art should, in light of the present disclosure, appreciate that many changes can be made in the specific embodiments which are disclosed and still obtain a like or similar result without departing from the spirit and scope of the disclosure.

Approach

To improve the performance of ME receivers, a multi-step approach was taken. As described in greater detail below, a model based on analytical expressions and equivalent circuit models for ME receivers were used to determine which factors could be optimized to increase the power density (the amount of power transferred divided by receiver footprint area (length×width)). The model was then experimentally validated using an ME receiver consisting of mechanically coupled Metglas and lead zirconate titanate (PZT). Based on these studies, key factors were identified that could be experimentally controlled and optimized to increase power density. Based on these findings, ME receivers were fabricated to test if our changes indeed would improve power density experimentally. Finally, to demonstrate that ME receivers can achieve large power densities through tissue under human safety limits, power received through 1-5 cm of porcine tissue was measured.

Results

Equivalent Circuit Model Study. To understand how $\alpha_{ME}$ can be maximized, the maximum ME voltage coefficient ($\alpha_{ME,max}$) was defined as a function of $Q_M$, k, $t_{total}$, and $\eta$, which are ME material properties that can be controlled during fabrication and clamping (Table I). To determine $\alpha_{ME,max}$, two assumptions were made. First, as depicted in FIGS. 2(a-d), $\alpha_{ME}$ depends on the driving frequency ($\omega=2\pi f$) of the magnetic field and is maximized when the driving frequency matches the acoustic resonant frequency ($\omega=\omega_r$) of the ME receiver. Because peak WPT performance is of interest, it was assumed that the ME receivers are operating at the acoustic resonant frequency ($\omega_r$) where the voltage and received power are maximized. Additionally, moderate electro-elastic coupling at the piezoelectric phase ($\varphi_p^2 \ll C_0/C_M$) was assumed to write $\omega_r$ as a function of the average sound velocity and the length of the ME receiver. Using these assumptions and Eq. 2, $\alpha_{ME,max}$ was defined as a function of $Q_M$, k, $t_{total}$, and $\eta$ as follows:

$$\alpha_{ME,max} = \alpha_{ME}|_{\omega=\omega_r} = F(k,\eta) \times Q_M \times t_{total} \qquad \text{Eqn. 3}$$

where $$F(k,\eta) = \frac{-8k\eta(\eta-1)d_{31,p}d_{33,m}}{\varepsilon_{33}\pi^2(k\eta s_{33,m} + (1-\eta)s_{11,p})}.$$

FIG. 6 includes plots showing how the ME voltage coefficient ($\alpha_{ME}$) depends on the above four variables based on the theoretical model disclosed herein. Panels (a-d) show $\alpha_{ME}$ as a function of frequency for varying (a) k, (b) $Q_M$, (c) $t_{total}$, and (d) $\eta$, which are ME material properties that can be controlled during fabrication and clamping. Increasing k from 0.2 to 1.0 and n from 0.1 to 0.9 decreases the resonant frequency. Increasing $Q_M$ from 10 to 90 and $t_{total}$ from 0.1 mm to 0.3 mm does not affect the resonant frequency. Panels (e-h) show the maximum ME voltage coefficient ($\alpha_{ME,max}$), which can be calculated from Eq. 3, as a function of (e) k, (f) $Q_M$, (g) $t_{total}$, and (h) $\eta$. As depicted in FIGS. 6(e-h), $\alpha_{ME,max}$ is linearly related to $Q_M$ and $t_{total}$ and non-linearly related to k and $\eta$, while $\alpha_{ME,max}$ increases with increasing $Q_M$, $t_{total}$, and k, $\alpha_{ME,max}$ is maximized at an optimal $\eta$. It will be appreciated that the curves of $\alpha_{ME,max}$ depicted in FIGS. 6(e-h) were generated by detecting the maximum $\alpha_{ME}$ value in individual curves shown in FIGS. 6(a-d).

The ME power transfer was also quantified in terms of predefined ME material properties. Here, the concept of the ME power coefficient ($p_{ME}$) is introduced. Analogous to the ME voltage coefficient, $p_{ME}$ is defined as the ratio of the power delivered to the load ($P_{rms}$) to the square of the amplitude of the magnetic field ($H_0^2$):

$$p_{ME} = \frac{P_{rms}}{H_0^2} \qquad \text{Eqn. 4}$$

The ME power coefficient ($p_{ME}$) was optimized to receive large power from ME receivers. Eq. 4 can be expressed in terms of other predefined variables:

$$p_{ME} = \frac{1}{2R_L}\left|\frac{Z_L\varphi_p\varphi_m}{Z_M + Z_L\varphi_p^2}\right|^2 \qquad \text{Eqn. 5}$$

Analogous to $\alpha_{ME,max}$, the maximum ME power coefficient ($p_{ME,max}$) was defined as a function of experimentally controllable ME material properties. FIG. 7 includes plots shows how the ME power coefficient ($p_{ME}$) depends on several experimentally controlled variables based on our theoretical model. Panels (a-d) show $p_{ME}$ as a function of load resistance for varying (a) k, (b) $Q_M$, (c) $t_{total}$, and (d) η. Increasing k from 0.2 to 1.0, $Q_M$ from 10 to 90, and $t_{total}$ from 0.1 mm to 0.3 mm, and η from 0.1 to 0.9 increases the optimal load ($R_L^{opt}$). Panels (e-h) shows the maximum ME power coefficient ($p_{ME,max}$), which can be calculated from Eq. 6, as a function of (e) k, (f) $Q_M$, (g) $t_{total}$, and (h) η.

As depicted in FIGS. 7(a) and 7(b), $p_{ME}$ depends on load resistance ($R_L$) and is maximized at an optimal load resistance ($R_L=R_L^{opt}$). By using the gradient descent method, $p_{ME,max}$ can be expressed as follows:

$$p_{ME,max} = p_{ME}\big|_{\omega=\omega_r \text{ and } R_L=R_L^{opt}} = G(k, \eta) \times Q_M \times t_{total} \quad \text{Eqn. 6}$$

where $$G(k, \eta) = \Gamma\left(\sqrt{\Gamma^2+1} - \Gamma\right)\left(\frac{2Wd_{33,m}^2(1-\eta)^2}{\pi s_{33,m}^2}\right)\left[\left(\eta\rho_p + \frac{1-\eta}{k}\rho_m\right)\left(\frac{\eta}{s_{11,p}} + \frac{1-\eta}{ks_{33,m}}\right)\right]^{-\frac{1}{2}} \text{ and } \Gamma = \frac{8Q_M d_{31,p}^2 \eta}{\pi^2 \varepsilon_p s_{11,p}^2} \times \left(\frac{\eta}{s_{11p}} + \frac{1-\eta}{ks_{33,m}}\right)^{-1}.$$

This equation provides a quantitative approach to evaluating $p_{ME,max}$ in terms of these experimentally controllable properties, which can be optimized to achieve higher power density. Specifically, as depicted in FIGS. 7(e-h), $p_{ME,max}$ is linearly related to $Q_M$ and $t_{total}$ and non-linearly related to k and η. $p_{ME,max}$ increases with increasing $Q_M$, $t_{total}$, and k and is maximized at an optimal η.

Equivalent Circuit Model Validation. The equivalent circuit model was validated for both bilayer and trilayer configurations and for different mechanical properties of the ME receiver. Thus, the equivalent circuit model can be used to accurately calculate the expected voltage and power from our ME receivers. To collect experimental data to validate our model, 9×3 mm² ME receivers were fabricated using 267-µm-thick PZT and 25-µm-thick Metglas, measured OCV and power for each ME receiver under 0.3-mT magnetic fields, and experimentally determined $Q_M$ and k.

FIG. 8 shows experimental validation of the equivalent circuit model of ME WPT for both bilayer and trilayer configurations and for different mechanical properties of the ME receiver. Experimental measurements (circles) for $\alpha_{ME}$ (red) and $p_{ME}$ (blue), show close agreement with the theoretical values (solid lines) calculated from the equivalent circuit model for (a) bilayer (Metglas-PZT) ME receivers and (b) trilayer (Metglas-PZT-Metglas) ME receivers. FIG. 8(c) includes a 2D contour plot showing theoretical values of $p_{ME,max}$ for varying $Q_M$ and k. Red circles represent data collected in this study using bilayer ME receivers, and a black diamond represents data from our group's previous work28. FIG. 8(d) shows that the percent error $$\left(\frac{|\text{theoretical} - \text{experimental}|}{\text{experimental}} \times 100\%\right)$$

of the theoretical $p_{ME,max}$ is less than 9% for all samples, indicating that the equivalent circuit model is valid over a range of $Q_M$ and k. Although a clear functional relationship is not observed between the interface coupling coefficient (k) and the mechanical quality factor ($Q_M$) (FIG. 7c), there may be an interdependence between these variables that may make it difficult to independently manipulate k and $Q_M$ experimentally. Nevertheless, the effects of these two terms are analyzed independently to develop an intuition as to how they separately affect the ME power transfer process.

Improvements in interface adhesion, clamping and material thickness result in increased power. From the equivalent circuit model analysis, three key factors were identified that could be optimized to increase the power density of our ME receivers: interface adhesion, clamping, and selection of material thicknesses. Based on these findings, ME receivers were fabricated and tested using various methods and confirmed experimentally that these factors do indeed improve ME receiver performance as predicted.

As shown in FIG. 1 and Table 1, model parameters k, $Q_M$, $t_m$, $t_p$, $t_{total}$, and η are ME material properties that can be optimized during fabrication and clamping to increase $p_{ME,max}$. Interface coupling factor (k) is affected by the adhesion of the Metglas and PZT layers. Mechanical quality factor ($Q_M$) is affected by interface adhesion and clamping. The thicknesses of both the Metglas ($t_m$) and PZT ($t_p$) layers affect both total thickness ($t_{total}$) and thickness ratio (η). Based on these dependencies, it was hypothesized that power density could be improved by experimentally improving interface adhesion, clamping, and selection of material thicknesses.

TABLE 1

List of the ME material properties that can be experimentally controlled and optimized.

| Name | Notation | Descriptions | Values | Controlled factors |
|---|---|---|---|---|
| Interface coupling factor | k | Mechanical coupling of Metglas and PZT interface | 0.42-0.70 | Interface adhesion |
| Mechanical quality factor | $Q_M$ | Strain amplification in ME receiver | 43.2-75.9 | Interface adhesion Clamping |
| Magnetostrictive material thickness | $t_m$ | Thickness of the Metglas | 25 (µm) | Number of Metglas layers |
| Piezoelectric material thickness | $t_p$ | Thickness of the PZT | 127, 267 (µm) | Thickness selection of PZT |
| Total thickness | $t_{total}$ | Thickness of ME receivers ($t_m + t_p$) | 152-317 (µm) | Number of Metglas layers Thickness selection of PZT |
| Thickness ratio | η | PZT thickness over total thickness ($t_p/t_{total}$) | 0.72-0.91 | Number of Metglas layers Thickness selection of PZT |

Interface adhesion was optimized by using a new adhesive to fabricate the ME receiver, resulting in higher output voltage. Based on previous studies, seven epoxies were selected for testing: Hardman Double Bubble Red, M-Bond 43-B, Devcon 5 Minute, West System 105A, Epo-Tek H20E, 3M ScotchWeld DP460, and Masterbond EP30LV. Each epoxy was used to fabricate at least 90 ME receivers of 5×2 mm$^2$ and measured the output voltage amplitude of each receiver at 1.5 mT.

FIG. 9 shows data to facilitate optimizing interface adhesion, clamping, and the thickness of each layer for increased power. FIG. 9(a) shows ME receiver performance for seven different epoxies (n≥90 for each). M-Bond epoxy resulted in a higher voltage amplitude compared to all other epoxies (***p<0.001 for all pairs via Wilcoxon rank sum test). The Hardman epoxy resulted in the lowest voltage amplitude. The M-Bond epoxy also showed a low standard deviation in voltage amplitude compared to the other epoxies, which is a consideration for fabrication yield. Based on its high voltage amplitude and low standard deviation, M-Bond 43-B was selected for the subsequent studies.

A new mechanical clamping package was engineered for the ME receiver that improved the mechanical quality factor ($Q_M$) and, in turn, the received power. In prior work, an adhesive clamping method was used to connect the ME receiver to devices. This method includes applying conductive silver epoxy on the surface of the ME receiver, which results in damping of the mechanical vibrations of the receiver and accordingly a lower $Q_M$. To minimize damping and increase $Q_M$, in this Example, a mechanical clamping method was designed that utilizes conductive spring-loaded pins. This present clamping method was compared to the prior one using 9×3 mm$^2$ bilayer ME receivers of 267-µm-thick PZT and 25-µm-thick Metglas under 0.3-mT magnetic fields. In FIGS. 8(c) and 8(d), the mechanical clamping method was used for Samples #1 through #3, and the adhesive clamping method was used for Samples #4 through #7. FIG. 9(b) shows the measured power and $Q_M$ for the two clamping methods. The mechanical clamping method resulted in a 57% increase in $Q_M$ and 67% increase in power (***p<0.001 via unpaired t-test).

FIG. 9(c) shows measured power from four different ME receiver configurations (config. 1-4, n=3 for each) as a function of magnetic field strength. FIG. 9(d) shows a magnified version of FIG. 9(c) from 0-1 mT.

Received power was also increased by utilizing different thicknesses for the Metglas and PZT layers in our ME receivers. To test varying thickness parameters, four versions of ME receivers (two bilayer and two trilayer configurations) were fabricated. The maximum power received by each ME receiver (n=3) with respect to magnetic field strength was measured. (FIGS. 9(c) and 9(d)). The trilayer receiver using 127-µm-thick PZT received the largest power, 9.78 mW at 0.6 mT, which is over 250% greater than that of the bilayer ME receiver using 267-µm-thick PZT. (FIG. 9(c)). This result is consistent with the predictions obtained from the equivalent circuit model analysis herein. It was also observed that ME receivers begin to saturate above 0.6 mT. (FIG. 9(d)). The equivalent circuit model accurately predicted experimental results in the pre-saturation regime. Note that FIGS. 9(c) and 9(d) compare the power at the optimal load resistance for each configuration.

High Power Density Experimentally Demonstrated through Porcine Tissue. The above results demonstrate that the optimized ME receivers can achieve large power densities through tissue within human safety limits. Specifically, power was transmitted wirelessly to 5×2 mm$^2$ and 9×3 mm$^2$ ME receivers through ex vivo porcine tissue using a magnetic field of 8.0 mT at the tissue surface, which complies with the IEEE Standard C95.1-2019 electric field safety limits for humans in unrestricted environments FIG. 10 shows results demonstrating improved performance of ME receivers in accordance with the build disclosed in this Example compared to other WPT technology. To represent a range of implantation depths, the thickness of the tissue was varied between the transmitter and ME receiver (Tx-Rx distance) from 1 to 5 cm. (FIG. 10(a), (inset).). At each TX-RX distance, the maximum power was measured with respect to load resistance and calculated the corresponding power density. In FIG. 10(a), the red and black lines represent the 5×2 mm$^2$ ME and the 9×3 mm$^2$ ME receivers, respectively. The points represent the average power density of each size, and the error bars show the standard deviation. Through 1 cm of tissue, the power density from 5×2 mm$^2$ and 9×3 mm$^2$ ME receivers was 3.1 mW/mm$^2$ and 2.1 mW/mm$^2$, respectively, resulting in a power delivery of 31 mW and 56 mW, respectively.

FIG. 10(b) shows a comparison of ME receivers configured in accordance with this Example to previously reported mm-sized bioelectronics wirelessly powered by ME, near-field inductive coupling (NIC), light, ultrasound, radiofrequency electromagnetic waves (RF), and mid-field inductive coupling (MDF). The comparison was focused on devices compatible with clinical applications in that the transmitter power levels were within safety limits. While there are many examples of wireless power for freely moving animals, these demonstrations often use transmitter power levels that are above the IEEE safety standards for human use and/or use transmitters too large to be comfortably worn. To directly compare the performance of different WPT modalities, the output power and power density that were evaluated demonstrated in in vivo animal models or ex vivo tissue experiments with at least 1 cm Tx-Rx distance for devices with a receiver area in the range of a few tens of mm$^2$. Of note, compared to a 16-mm$^2$ NIC-powered device, which has the largest power of previously reported devices in our comparison, over 5 times larger power was achieved.

Analysis

This Example suggests that ME enables the largest power densities reported for mm-sized battery-free bioelectronics. Disclosures herein define power density as the output power delivered to the load resistance divided by the footprint (length×width) of the ME receiver, as had been done in prior work. In most applications, the footprint is orders of magnitude larger than the cross-sectional area (thickness×width). As a result, the footprint area when calculating the power density because this metric determines the amount of space required for the power-receiving element. To achieve higher power in a small device, this power density is a primary factor that one would seek to optimize. In this Example, an experimentally validated model for ME WPT was demonstrated and used to determine three key factors that could be optimized to achieve large power density: interface adhesion, clamping, and selection of material thicknesses. By optimizing these factors, a power of 56 mW and 31 mW was achieved through 1 cm of porcine tissue using 27-mm$^2$ and 10-mm$^2$ ME receivers, respectively. This is over 4 times larger power density and over 5 times larger power than previously reported for similarly sized bioelectronic devices at similar tissue depths. (FIG. 10(b).)

Disclosures set forth herein have many practical applications. For example, this work can be used as a guideline for ME receiver fabrication and packaging for applications that benefit from an improvement of or optimization for power, size, and safety requirements. While the equivalent circuit model used is accurate for ME receivers at lower magnetic field strengths (in the pre-saturation regime) (FIG. 10(d)), improvements in the pre-saturation regime led to improvements in the saturation regime even across other ranges. Additionally, the total power transferred depends onload resistance, which can be calculated from our model. As shown in FIG. 7(d), the load resistance at which the highest power is achieved depends on η. At low η, power sharply decreases at nonoptimal load resistances; at high η, power stays relatively constant at nonoptimal load resistances. These findings inform circuit design to prioritize n and impedance matching. Furthermore, while it was not sought to optimize the length and width of the materials in this Example, these factors can also be studied using a disclosed model.

This Example shows that ME WPT is heavily dependent on the receiver's material properties; therefore, advancement and innovation in ME material engineering may further improve the power density and total power transfer of ME receivers. Here, an order of magnitude improvement was observed when compared to previously reported ME receivers.

Some embodiments of the present disclosure include a system comprising one or more data processors and a non-transitory computer-readable storage medium containing instructions which, when executed on the one or more data processors, cause the one or more data processors to perform part or all of one or more methods disclosed herein.

In some embodiments, the system includes a non-transitory computer-readable storage medium containing instructions which, when executed on the one or more data processors, cause the one or more data processors to perform part or all of one or more methods and/or part or all of one or more processes disclosed herein. Some embodiments of the present disclosure include a computer-program product tangibly embodied in a non-transitory machine-readable storage medium, including instructions configured to cause one or more data processors to perform part or all of one or more methods and/or part or all of one or more processes disclosed herein.

The terms and expressions which have been employed are used as terms of description and not of limitation, and there is no intention in the use of such terms and expressions of excluding any equivalents of the features shown and described or portions thereof, but it is recognized that various modifications are possible within the scope of the invention claimed. Thus, it should be understood that although the present invention as claimed has been specifically disclosed by embodiments and optional features, modification and variation of the concepts herein disclosed may be resorted to by those skilled in the art, and that such modifications and variations are considered to be within the scope of this invention as defined by the appended claims.

The present description provides preferred exemplary embodiments only, and is not intended to limit the scope, applicability or configuration of the disclosure. Rather, the present description of the preferred exemplary embodiments will provide those skilled in the art with an enabling description for implementing various embodiments. It is understood that various changes may be made in the function and arrangement of elements without departing from the spirit and scope as set forth in the appended claims.

Specific details are given in the present description to provide a thorough understanding of the embodiments. However, it will be understood that the embodiments may be practiced without these specific details. For example, circuits, systems, networks, processes, and other components may be shown as components in block diagram form in order not to obscure the embodiments in unnecessary detail. In other instances, well-known circuits, processes, algorithms, structures, and techniques may be shown without unnecessary detail in order to avoid obscuring the embodiments.

The invention claimed is:

1. A system comprising:
 a magnetoelectric (ME) component comprising:
  one or more first layers, wherein each of the one or more first layers comprises a piezoelectric material; and
  one or more second layers, wherein each of the one or more second layers comprises a magnetostrictive material; and
 an energy harvesting circuit comprising a rectifier circuit, wherein the energy harvesting circuit is coupled to the ME component, wherein the energy harvesting circuit includes one or more power point tracking circuits configured to:
  electrically decouple, via a bi-directional converter, the ME component from at least one load configuring a load-independent power at output of the rectifier circuit;
  regulate output voltages for different voltage domains;
  store excess harvested energy from the ME component in a storage element via the bi-directional converter configuring bi-directional transfer of energy to or from the storage element, wherein the storage element is independent from the ME component; and
  trigger usage of at least part of the stored excess harvested energy to the at least one load by the bi-directional converter upon detecting that power harvested from the ME component by the energy harvesting circuit is below a threshold.

2. The system of claim 1 wherein the magnetostrictive material includes metglas.

3. The system of claim 1 wherein the piezoelectric material includes Lead zirconate titanate (PZT).

4. The system of claim 1, wherein the rectifier circuit includes a full-bridge rectifier.

5. The system of claim 1, wherein the one or more power point tracking circuits include a maximum power point tracking circuit that, via the bi-directional converter, dynamically adjusts an electrical impedance of the energy harvesting circuit to present an optimal impedance to the magnetostrictive material across a range of workloads.

6. The system of claim 1, wherein the rectifier circuit includes an active full-bridge rectifier.

7. The system of claim 1, wherein the one or more power point tracking circuits include a maximum power point tracking circuit, and wherein the energy harvesting circuit is configured to operate at a maximum power point of the magnetostrictive material regardless of a workload of the system by tracking a half-open-circuit voltage of ME and DC-DC impedance tuning.

8. The system of claim 1, wherein the storage element includes a capacitor.

9. The system of claim 1, wherein the storage element includes a battery.

10. The system of claim 1, wherein the energy harvesting circuit includes a bidirectional dc-dc converter.

11. The system of claim 1, wherein the energy harvesting circuit includes a unidirectional dc-dc converter.

12. The system of claim 1, further comprising the storage element connected to the rectifier circuit.

13. The system of claim 12, wherein the system is configured to store energy into the storage element when a detected maximum power of the system is larger than the at least one load at a rectifier of the energy harvesting circuit.

14. The system of claim 1, further comprising an open-circuit voltage sampler.

15. The system of claim 14, wherein the open-circuit voltage sampler is configured to sample magnetoelectricity at a beginning of a power transfer phase to the system.

16. The system of claim 1, wherein the system is an implantable bioelectronic device.

17. The system of claim 16, wherein the system is a batteryless implant.

18. The system of claim 16, wherein a total thickness of the implantable bioelectronic device is less than 1 mm.

19. The system of claim 1, further comprising:
one or more electrodes configured to record electrical signals.

20. The system of claim 1, further comprising:
a capacitor; and
a switching circuit, wherein the switching circuit is configured to dynamically change a connection with the capacitor.

21. The system of claim 1, further comprising a low noise amplifier.

22. The system of claim 1, wherein a mechanical coupling of a first layer of the one or more first layers and a second layer of the one or more second layers is configured to have an interface coupling factor between 0.42 and 0.70.

23. The system of claim 1, wherein a mechanical quality factor of the system is between 43.2 and 75.9.

24. The system of claim 1, wherein a thickness of the one or more second layers is between 20 mm and 30 mm.

25. The system of claim 1, wherein a thickness of the one or more first layers is between 100 mm and 150 mm.

26. The system of claim 1, wherein a thickness ratio of a cumulative thickness of the one or more first layers relative to a sum of the one or more first layers and the one or more second layers is between 0.70 and 0.95.

* * * * *